United States Patent
Shveykin

(10) Patent No.: US 7,787,508 B2
(45) Date of Patent: Aug. 31, 2010

(54) INJECTOR LASER

(75) Inventor: Vasily Ivanovich Shveykin, Moscow (RU)

(73) Assignee: General Nano Optics Limited, Nicosia (CY)

( * ) Notice: Subject to any disclaimer, the term of this patent is extended or adjusted under 35 U.S.C. 154(b) by 260 days.

(21) Appl. No.: 11/997,877

(22) PCT Filed: Jul. 7, 2006

(86) PCT No.: PCT/RU2006/000362

§ 371 (c)(1),
(2), (4) Date: Feb. 4, 2008

(87) PCT Pub. No.: WO2007/018451

PCT Pub. Date: Feb. 15, 2007

(65) Prior Publication Data

US 2008/0192789 A1    Aug. 14, 2008

(30) Foreign Application Priority Data

Aug. 5, 2005    (RU) ............................... 2005124940

(51) Int. Cl.
*H01S 5/00* (2006.01)
(52) U.S. Cl. .............. 372/44.01; 372/43.01; 372/46.01; 372/46.011; 372/46.014; 372/49.01
(58) Field of Classification Search .............. 372/43.01, 372/44.01, 46.01, 46.011, 46.014, 49.01
See application file for complete search history.

(56) References Cited

U.S. PATENT DOCUMENTS 6,429,462 B1 * 8/2002 Shveykin ..................... 257/95
6,748,002 B2    6/2004 Shveykin

FOREIGN PATENT DOCUMENTS

| JP | 59-031084 A | 2/1984 |
| JP | 59031084 A | 2/1984 |
| RU | 2109382 C1 | 4/1998 |
| RU | 2110874 C1 | 5/1998 |
| RU | 6748002 B2 | 6/2004 |

* cited by examiner

*Primary Examiner*—Minsun Harvey
*Assistant Examiner*—Yuanda Zhang
(74) *Attorney, Agent, or Firm*—Haynes and Boone, LLP; Pavel I. Pogodin

(57) ABSTRACT

Injection radiators are used for pumping solid-state and fiber lasers and amplifiers used for producing medical devices, laser production equipment, lasers generating a double-frequency radiation and in the form of highly efficient general-purpose solid-state radiation sources used in a given waveband, including white light emitters used for illumination. Said invention also relates to superpower highly-efficient and reliable injection surface-emitting lasers, which generate radiation in the form of a plurality of output beams and which are characterised by a novel original and efficient method for emitting the radiation through the external surfaces thereof.

11 Claims, 6 Drawing Sheets

INJECTOR LASER

FIELD OF THE INVENTION

The invention relates to optoelectronic technology, namely—to the effective powerful and compact semiconducting injection lasers (diode lasers) operating in a broad range of wavelengths.

DESCRIPTION OF THE RELATED ART

Various types of injection lasers are known: the injection lasers with a stripe active region of generation and with the output of emission through the edge mirror of the optical resonator [S. S. Ou et al., Electronics Letters (1992). v. 28, No. 25, pp. 2345-2346], the surface-emitting injection lasers with the vertical resonator [A. Krigge et al., Electronics Letters, 2001, vol. 37, No. 20, pp. 1222-1225], the injection lasers with the outgoing emission in the optical resonator [Shveykin V. I., U.S. Pat. No. 6,748,002 B2, Jun. 8, 2004].

From the standpoint of technical substance and technical problem to be solved the closest the injection laser-prototype with a surface emission was described in the following work [Sveykin V. I., Patent RU 2109382 C1, Bup. No 11, 20.04.98]. The said injection laser includes the multilayer heterostructure placed on the substrate; the said heterostructure has the active layer. The said injection laser also includes the stripe active region of generation, optical resonator, reflectors, ohmic contacts, device for output of emission with covers, the arrangement for suppression of the lateral superluminescent emission. In this case at least two cells of generation are formed in the stripe active region which make up at least one bar of the laser emission generation; the said cells are constrained at least on the one side by the device for output of emission executed in the form of the additionally introduced cavity with two reflectors and the region transparent for the output emission. The cavity is placed on the side of the surface of the heterostructure. The reflectors are placed on the inclined surfaces of the cavity. At that the angle $\psi$ is created, formed by the direction of the cavity reflector rib on the surface of the heterostructure and the direction of lateral sides of the stripe generation region, and which is chosen within the following range: $(\pi/2)-\arcsin(1/n) < \psi < (\pi/2)+\arcsin(1/n)$, where n—is the refraction index of the region transparent for the output emission. Besides at least for one reflector of the cavity the angle $\beta$ is created which is formed by the normal line mentally drawn on the plane surface of the active layer to the line of intersection of its plane with the plane surface of the indicated cavity reflector and the normal line drawn towards the surface of the indicated reflector. The said angle is chosen within the following range: $(1/2)\arcsin(1/n) < \beta < (\pi/2)-(1/2)\arcsin(1/n)$. With respect to the surface of the heterostructure the bottom of the cavity is placed at the distance determined by the energy flux $P_{IN}$ of the amplified emission being propagated during operation of the device. The said energy flux is determined in the heterostructure cross-section which is normal to heterostructure layers at the beginning of the regeneration cell and also determined by the total amplification in the indicated cell. The said amplification depends on the set up pumping current, on the length of the indicated cell and on configuration of the heterostructure. At that the energy flux $P_{IN}$ is chosen within the range 0.99-0.001 of the value of the total energy flux of the amplified emission at the end of the preceding region of generation. The total amplification in the indicated cell is chosen in inverse proportion to the energy flux $P_{IN}$. Further, there is the region transparent for the output emission and placed along the direction of propagation of emission (during operation of the device), which is reflected of the cavity reflector. In the said region the external output emission surface is introduced adjacent at least one side to the surface of the output of emission.

The basic advantage of the injection laser—prototype consists in possible increase of the output power of emission stipulated by multiple increase of its length. At the same time there are technological complexities in accuracy and repeatability by manufacture of the arrangements for emission output being executed in the form of narrow cavities in the heterostructure and located in the immediate vicinity of the active layer. This can lead to a great diffractional divergence of emission at the output cells and correspondingly to increase of optical losses by output of emission and to decrease of its efficiency. This fact can create difficulties by securing the necessary resources of operability and reliability. Also there are certain restrictions consisting in the fact that output of emission is executed only through the substrate which should be transparent for laser emission.

SUMMARY OF THE INVENTION

The basis of the present invention is the creation of the superpowerful injection laser of the new type (hereafter—the Laser) with surface output of emission from the active layer in the form of the multitude of the output laser beams and functioning in the known broad range of wavelengths of emission and also based on the original effective and non-obvious way of the output of emission.

Technical results consist in the fact that the length of the proposed Laser is in principle unlimited (the indicated length is restricted only by the size of the used semi-conducting substrate), that the density of emission at the output facets of the Laser is significantly reduced (by the factor of $10^{-2}$-$10^{-3}$), what stipulates a super-high power of laser emission, high efficiency, low optical losses of emission and their independence on the Laser length, low threshold current, low ohmic losses which are decreasing with increase of the Laser length, higher resource of operability and high reliability of the Laser and also that directivity and divergence of the output emission are controlled in a wide range and that the technological process of the Laser manufacture is simplified.

According to the invention the above indicated technical results are achieved through the fact that proposed injection laser includes the laser heterostructure containing at least one active layer consisting of at least one sublayer. The said Laser also includes edge facets, longitudinal amplification axis, optical resonator, metallization layers consisting at least of one sublayer. In this case in the said heterostructure in the direction of the longitudinal amplification axis at least one sequence is placed. This sequence has alternating at least one emission amplification region consisting of at least one subregion and at least one emission output region consisting of at least one subregion. In the output region together with layers of the laser heterostructure there is a semiconducting layer for leak-in of emission raising above the amplification region and consisting of at least one sublayer. Every output region is restricted on its opposite sides in the direction of the longitudinal amplification axis by the output facets located under certain linear angles of inclination $\alpha_1$ and $\alpha_2$, correspondingly with respect to the external surface of the amplification region, and the ratio of the refraction index $n_{IN}$ of the leak-in layer to the effective refraction index $n_{eff}$ of the heterostructure with the leak-in layer included into it is equal to the number which is greater than one.

A significant difference of the proposed Laser consists in the fact that for the first time original and non-obvious output of laser emission propagating in the optical waveguide along the longitudinal amplification axis is executed through the external surface of the Laser with the help of the emission output regions which are discretely distributed inside the laser heterostructure and have original composition, structure and sizes. At that the composition, structure and dimensions of the output regions and their output facets are such that the output of emission is realized in the form of leaky emission. The proposed Lasers are characterized by high efficiency increasing with growth of their length and in contrast to modern injection lasers they are characterized by a significantly lower (by the factor of $10^{-1}$-$10^{-3}$) density of laser emission at the output facets, by the controlled directivity and divergence of laser emission, by low optical losses, reduced threshold current density and also by reduced ohmic and thermal resistances. This fact make possible to secure high reliability of the Laser operation by superhigh power values of laser emission and to simplify significantly the technological process of Laser manufacture.

Technical results are also achieved through the fact that on both edge facets there are the reflectors of the optical resonator with reflection coefficients approximately equal to one. Trough this fact, in particular, the reduction of the threshold current density is achieved.

Technical results are also achieved through the fact that in the heterostructure in the amplification region on the side of the emission output there are the layers which are executed with such compositions and thickness values by which partial restriction of emission in the heterostructure is realized in the amplification region on the indicated side. On the said surface of heterostructure the metallization sublayer with the high coefficient of emission reflection is placed. Through this fact in particular the increase of the emission power and simplification of manufacture technology are achieved.

Technical results are also achieved through the fact that corresponding metallization layer is placed in the output region on the external surface of the leak-in layer. As a result efficiency is increased in particular and the Laser threshold current is reduced.

Technical results are also achieved through the fact that the reflector is placed on one of the edge facets. The dimensions of the said reflector allow to reflect all laser beams directed on it. As a result unidirectionality of laser emission with a reduced divergence angle is achieved.

Technical results are also achieved through the fact that in the heterostructure in the amplification region on the side opposite to the emission output side there are the layers which are executed with such compositions and thickness values by which a partial restriction of emission in the heterostructure is realized in the amplification region on the said side. On the said side on the surface of heterostructure the metallization sublayer with the high coefficient of emission reflection is placed. Through this fact in particular the increase of the Laser efficiency and simplification of manufacture technology are achieved.

Technical results are also achieved through the fact that at least two stripe amplification subregions are formed in each amplification region. The said stripe amplification subregions are located along the longitudinal amplification axis while the space between them is filled by a substance with the refraction coefficient lower than the effective refraction coefficient of the heterostructure in the said amplification subregions. In particular this fact allows to get the single-mode laser emission of high power.

Technical results are also achieved by the different versions of execution of the Laser output region proposed below.

Linear angles of inclination of the output facets $\alpha_1$ and $\alpha_2$ are made equal by absolute values (equal to $\pi/2$). At that the leak-in layer in the output region has a thickness no less then the length of the output region multiplied by the tangent of the leak angle $\phi$ while the angle $\phi$ is equal to the arc cosine of the ratio $n_{eff}$ to $n_{IN}$. Through this fact the corresponding directivity and angle divergence of laser beams are achieved.

Corresponding directivity of laser beams is also achieved by the fact that the linear angles $\alpha_1$ and $\alpha_2$ of inclination of the output facets are executed with equal absolute values and equal to $(\pi/2)+(\phi)$, and also to $(\pi/4)+(\phi/2)$ and to $(3\pi/4)-(\phi/2)$.

Technical results are also achieved through the fact that autonomous expanded ohmic contacts (the metallization layers) are formed on the multitude of the emission output regions and on the multitude of amplification regions. This in particular makes possible to optimize dimensions of the amplification regions and the output regions and also to increase efficiency and power of the Laser emission.

Technical results are also achieved through the fact that in the middle of every output region along its whole length the amplification regions of a stripe form are formed. The said stripe amplification regions are totally identical to the amplification regions with the corresponding metallization layers the widths of which much less than the widths of the output regions This fact in particular leads to reduction of the Laser threshold current and to increase of the emission power.

Technical results are also achieved through the fact that the Laser includes at least two sequences of alternating at least one emission amplification region consisting at least of one subregion and at least of one emission output region consisting of at least one subregion which are connected in parallel by the current. Through this increase of the Laser emission power is achieved approximately by the number of times equal to the number of the in parallel connected indicated sequences.

Technical results are also achieved through the fact that the Laser includes at least two above indicated sequences which are connected in series by the current. As a result, at the same current values, the increase of the Laser emission power is achieved. The said emission power is approximately increased by the number of times equal to the number of the series connected indicated sequences (due to corresponding increase of the voltage applied to the Laser).

Essence of the present invention consists in creation in its integral execution of the new type of Laser with surface output of emission out of the active layer in particular in the form of the great number of beams. The said Laser is based on the proposed original effective and non-obvious way of the emission output using properties of the outflow emission. The original and effective emission output regions are introduced into the active region and are discretely distributed along the length of emitter (the length is in principle not limited). The said output regions secure super-high emission power with the high reliability of their operation as well as reduction of optical losses of emission and their independence on the Laser length, increase of efficiency, very significant reduction of the emission density (by the factor of $10^{-1}$-$10^{-3}$) on the output facets, controlled directivity and divergence of the laser emission, reduced values of ohmic and thermal resistances and also significant simplification of the technological process of Laser manufacture.

BRIEF DESCRIPTION OF THE DRAWINGS

The present invention is explained by the FIGS. 1-11.

DETAILED DESCRIPTION OF PREFERRED EMBODIMENTS

Figure 1:
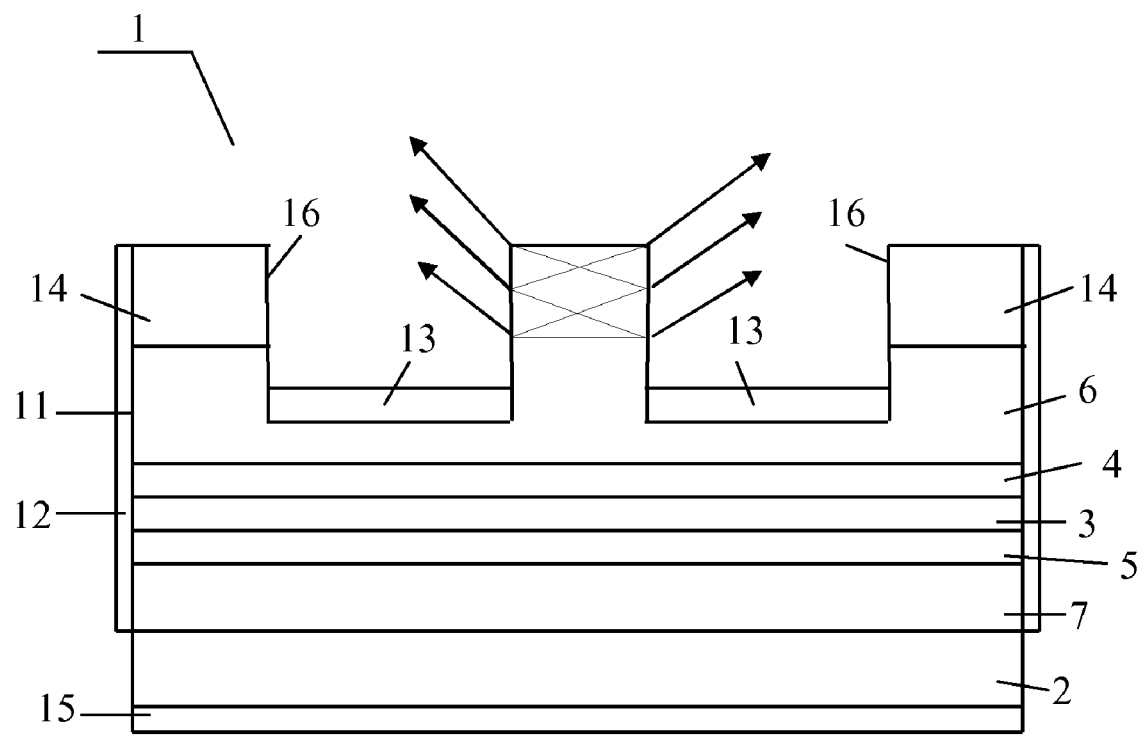
FIG. 1 schematically describes the longitudinal cross-section of the proposed multibeam Laser with the sequence of alternating two amplification regions and three emission output regions the output facets of which are perpendicular to the external surface of the amplification region.

In the following the invention will be explained by concrete versions of its execution with references to the enclosed drawings. The presented examples of the Laser modification aren't unique and allow presence of other realizations including wavelengths within certain ranges the features of which are reflected in the multitude of attributes of the Claims.

The proposed Laser 1 (see FIG. 1-3) contains the laser heterostructure placed on the substrate 2 of the n-type GaAs. The said heterostructure is made on the basis of compounds InAlGaAs with the active InGaAs layer 3, with the waveguide layers 4, 5 and the confining layers 6, 7 of AlGaAs, placed correspondingly on the side of emission output and on the side opposite to it. The wavelength of laser emission was chosen equal to 0.98 µm. The functional bar of the Laser 1 is executed as a stripe and consists of alternating amplification regions 8 and output regions 9. The said alternation goes along the longitudinal optical axis. The width values amplification regions 8 and output regions 9 are identical and equal to 100 µm. The lateral sides of the said regions 8 and 9 are restricted by the lateral confining regions 10 of ZnSe. On the edge facets 11 the film reflectors 12 of the optical resonator Fabry-Perot with the reflection coefficient 99% were formed. On the side of the emission output the thickness and composition of the confining layer 6 in the amplification region 8 were chosen in such a way that partial restriction of emission in the heterostructure is realized. To the external surface of the amplification regions 8 the metallization sublayer 13 is attached made of silver with the reflection coefficient of emission equal to 98%. The output region 9 contains the additional semi-conducting leak-in layer 14 of GaAs the distinctive feature of which consists in the fact that its refraction index $n_{IN}$ exceeds the effective refraction index $n_{eff}$ of the laser heterostructure with the leak-in layer 14 included into it. Connection by the current of all amplification regions 8 is realized by expansion the metallization layer 13 not only to the external surface of the amplification regions 8 but also to the lateral confining regions 10 (the expansion contact of the amplification regions 8). Corresponding metallization layer 15 is also applied to the substrate 2. The output facets 16 confining the output region 9 along the longitudinal amplification axis are perpendicular to the external surface of the amplification region 9 and at that the angles $\alpha_1$ are by absolute values equal to the angles $\alpha_2$ and are equal to 90°. In this case the output regions 9 raising above the external surface of the amplification regions 8 have the form of the rectangular parallelepiped. The length of the Laser 1 is chosen equal to 20010 µm. The lengths of the amplification regions 8 and the output regions 9 were chosen equal to 90 µm and 10 µm correspondingly. At that the numbers of the regions 8 and the output regions 9 formed in the functional bar are equal to 200 and 201 correspondingly. The output emission of the Laser 1 consists of 400 beams a half of which is directed in one direction along the longitudinal amplification axis and another half of which is directed in the opposite direction. For this modification of the Laser 1 the outflow angle $\phi$ was set equal to 10° through appropriate choice of compositions and thickness values of the layers of heterostructure and of the leak-in layer 14. At that the refraction angle $\beta$ for the output beams is equal to 30°. The chosen thickness of 6.0 µm of the emission output regions 9 is approximately equal to the triple value of the product of the length of the output region 9 by the tangent of the outflow angle $\phi$. In this case the calculated portion of the output emission by thrice-repeated incidence of beams on the output facet 16 contains 98%. The diffraction divergence of every beam is approximately equal to 9°. The calculated power of the output emission $P_{EM}$ is equal to 200 W (by 0.5 W for every output beam). At that the average density of emission on the output facet 16 makes up totally 125 kW/cm². The differential efficiency $\eta_H$ is equal to 85%. The efficiency factor (coefficient of efficiency from the outlet) is equal to 80%.

The following modification of the Laser 1 differed from the previous one by the fact that on the side of one edge facet 11 the introduced reflector (not shown in the figures) with the sizes allowing to reflect all laser beams directed to it is connected. At that the total laser emission with low divergence is formed as unidirectional emission to the side of the opposite edge under the angle $\beta$ equal to 30° with respect to the longitudinal amplification axis.

Figure 2:
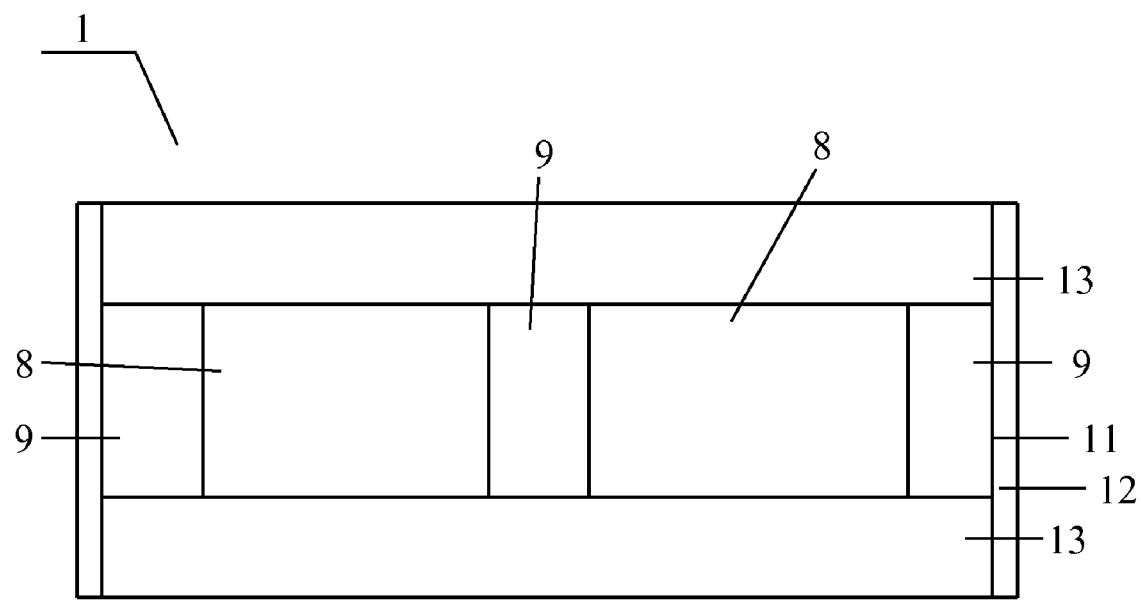
FIG. 2 schematically describes the view from above of the proposed Laser the longitudinal cross-section of which is sketched out in the FIG. 1
Figure 3:
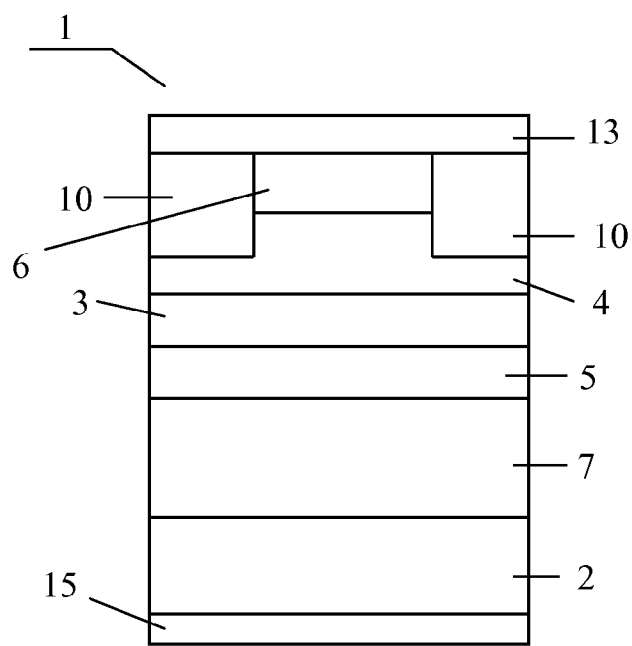
FIG. 3 schematically describes the cross-section in amplification region of the Laser the longitudinal section of which is sketched out in the FIG. 1.

The following modification of the Laser 1 differed from the modification shown in the FIG. 1-3 by the fact that the Laser 1 contained only one output region 9 located between two identical amplification regions 8 with the corresponding enlarged size of the regions.

Figure 4:
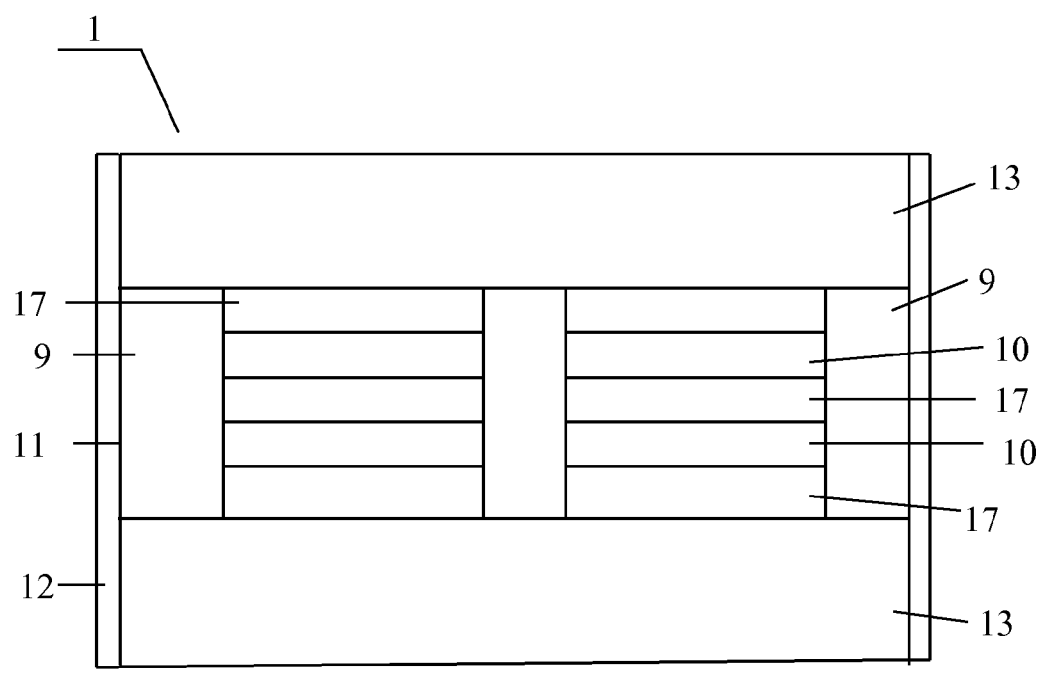
FIG. 4 schematically describes the view from above on the side of emission output of the proposed Laser two amplification regions in which are divided into three parallel located amplification.

The next modification of the Laser 1 (see FIG. 4) differed from the modification shown in the FIG. 1-3 by the fact that every amplification region 8 consisted of ten (in the FIG. 4 of three) located in parallel stripe amplification subregions 17 with the width of 10 µm each and the placed between them lateral confining regions 10 with the width of 5 µm each filled by the sprayed dielectric ZnSe up to the appropriate optimum depth. Over the stripe subregions 17 and the lateral confining regions 10 metallization layers 13 are applied (not shown in the FIG. 4).

Figure 5:
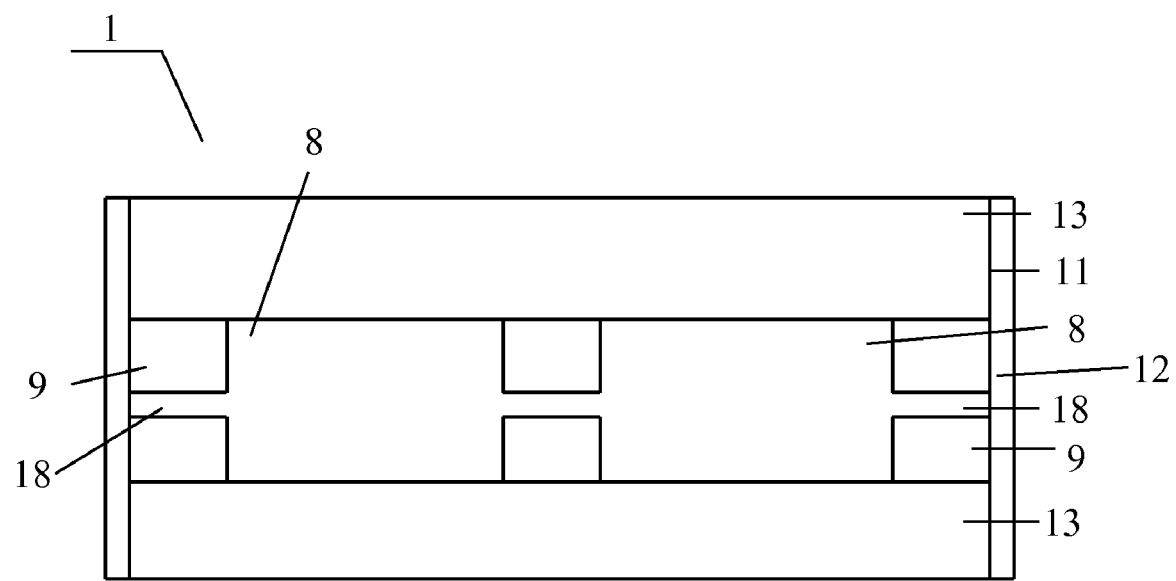
FIG. 5 schematically describes the view from above on the side of emission output of the proposed Laser in which three additional narrow amplification regions are introduced which connect the amplification regions along the whole length of the Laser.

The following modification (see FIG. 5) differed from the modification of the Laser 1 shown in the FIG. 1-3 by the fact that in the middle of every output region 9 along the total length the additional amplification regions 18 of the stripe form were formed with the corresponding metallization layers 13 (not shown in the FIG. 5, both on the amplification regions 8 and 18 and also on the output regions 9) connecting by the current the amplification regions 8 along all length of the Laser 1 equal to 20010 µm. By that the width of the introduced additional generation regions is equal to 4 µm.

Figure 6:
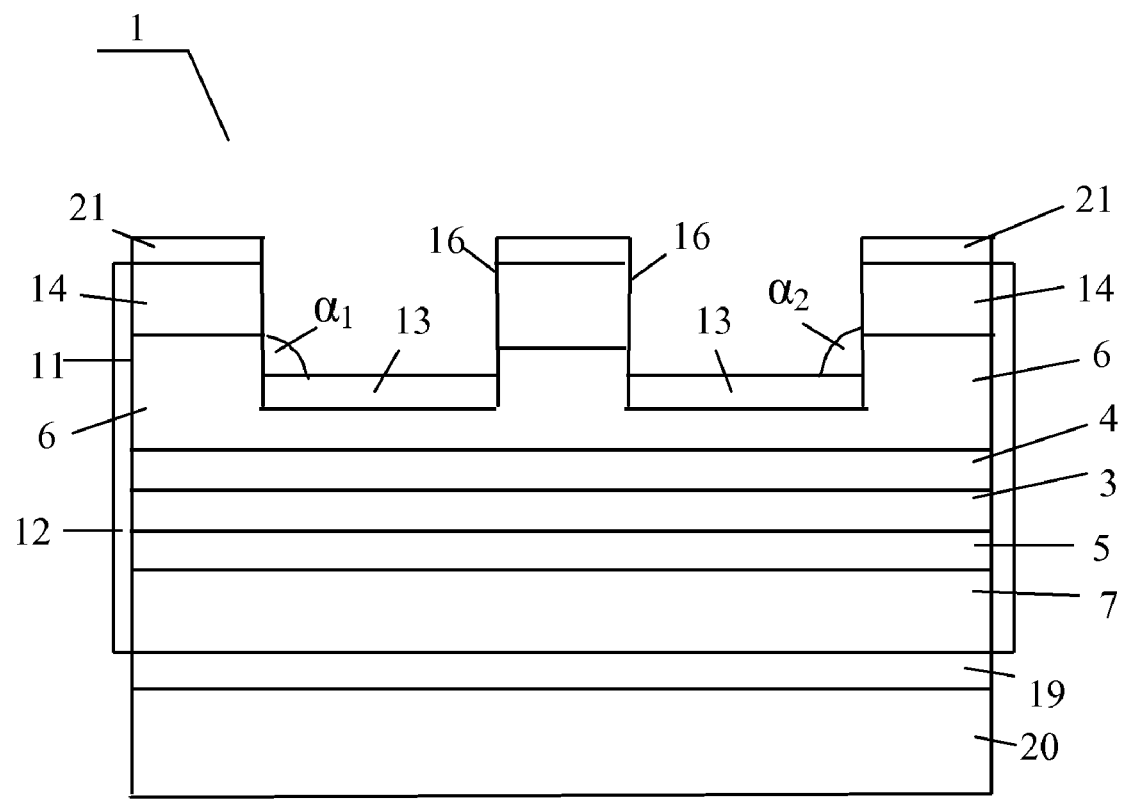
FIG. 6 schematically describes the longitudinal section of the proposed Laser with the removed substrate in which on the side opposite to the emission output side the metallization layers with the heat-removing plate are connected directly to the heterostructure.
Figure 7:
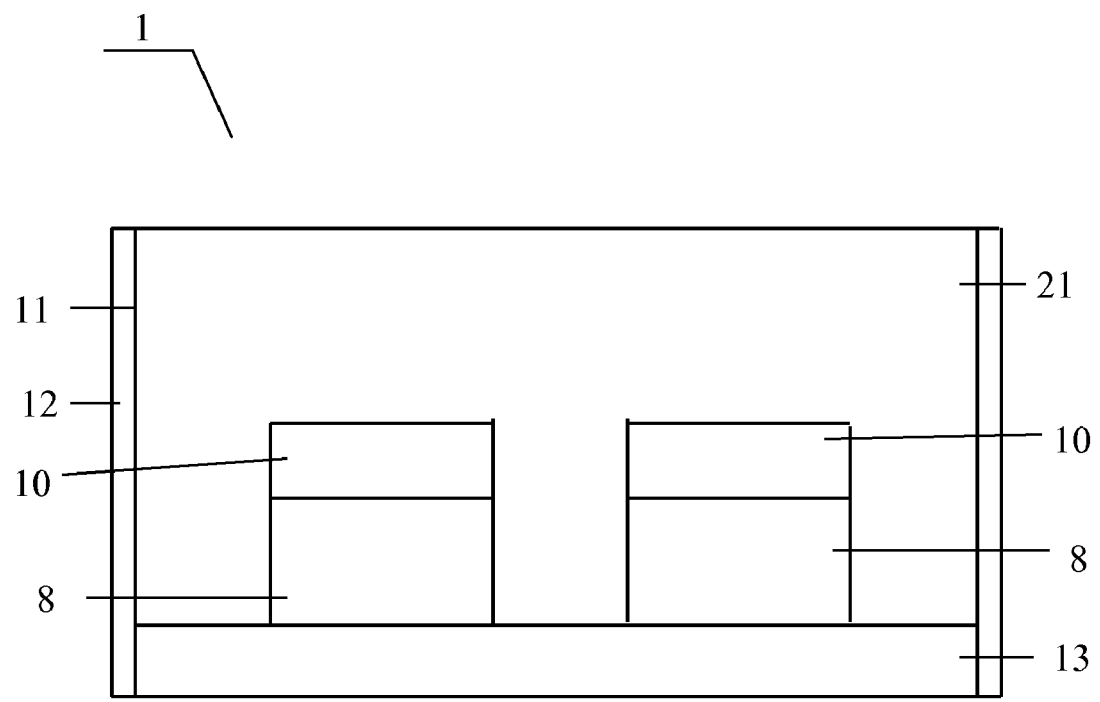
FIG. 7 schematically describes the view from above of the proposed Laser the longitudinal section of which is sketched out in the FIG. 6.
Figure 8:
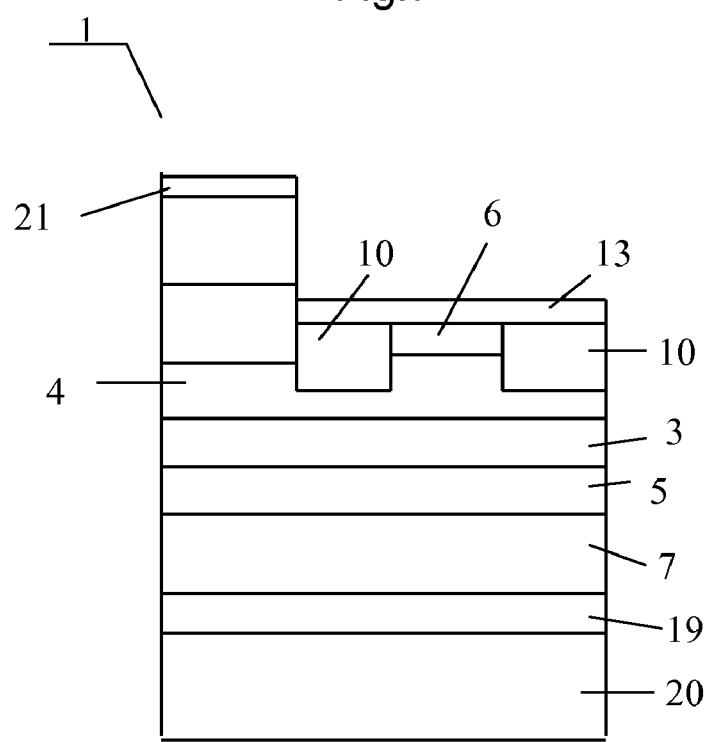
FIG. 8 schematically describes the cross-section in the amplification region of the Laser with double-level metallization layers for the amplification region and the output region the longitudinal section of which is sketched out in the FIG. 6.

The proposed Laser 1 (see FIG. 6-8) differed from modification of the Laser 1 shown in the FIG. 1-3 by the fact that on the side opposite to the side of emission output the substrate 2 is removed and thickness and composition of the confining layers 6 and 7 were chosen in such a way that a partial restriction of emission in the heterostructure is realized. At that to the external surfaces of the confining layers 6 and 7. the corresponding metallization layers 13 and 19 including silver sublayers were connected. The said layers 13 and 19 includes the layers of silver with the emission reflection coefficient equal to 98%. On the side opposite to the emission output side the Laser 1 is connected to the conducting plate 20 of CuW together with which it is placed on the copper heat-removing base (not shown in the figures). Besides corresponding metallization layers 21 are connected to the leak-in layer 14 of the output regions 9. Connection by the current of all output regions 9 is executed through expansion of the metallization layers 21 (by the level of leak-in layers 14) onto one of the lateral sides of the Laser 1 (expanded autonomous contact of the output regions 9).

The following modification of the Laser 1 differed from the previous one by the fact that the above indicated metallization layers 13 and 19 were connected directly to the waveguide layers 4 and 5.

The proposed Laser 1 (see FIG. 9) differed from modification of the Laser 1 shown in the FIG. 1-3 by the fact that the output facets 16 confining the output regions 9 along the longitudinal amplification axis were executed as inclined to the external surface of the amplification region 8 and at that the angles $\alpha_1$ by absolute value are equal to the angles $\alpha_2$ and are equal to 100°. In this case the output region 9 has the form of trapezium in its longitudinal section. For increase of efficiency of the Laser 1 antireflecting optical coatings (not shown in the figure) are applied on the output facets 16 of the output regions 9. Thickness of the leak-in layer 14 in the output region 9 was chosen equal to 2.0 µm. In this modification every laser beam falls under the right angle on the inclined facet 16 and straightly goes out of the Laser 1.

The following modification differed from the previous one by the fact that optical coatings (not shown in the figures) with the reflection coefficient of 99% are applied on the output facets 16 the output emission from which is directed into one of the selected (one of two) directions.

Figure 9:
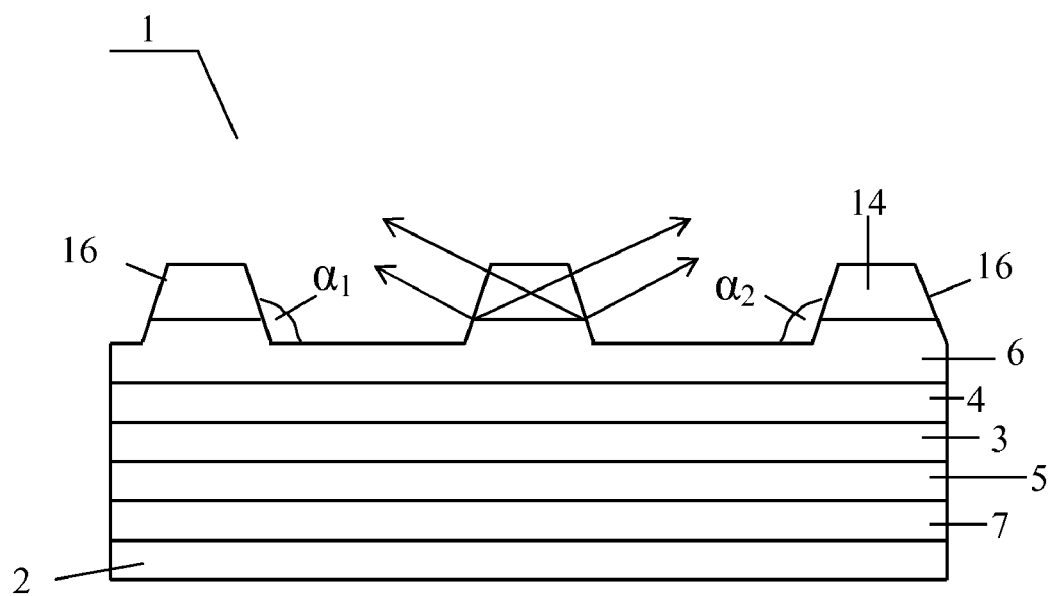
FIG. 9-11 schematically describe (without metallization layers): the longitudinal cross-sections of the proposed Lasers the output facets of which are inclined and form linear angles of inclination $\alpha_1$ and $\alpha_2$ with the external surface of the amplification regions: in the FIG. 9—the angles are equal to $(\pi/2)+(\phi)$, in the FIG. 10—the angles are equal to $(\pi/4)+(\phi/2)$, in the FIG. 11—the angles are equal to $(3\pi/4)-(\phi/2)$.
Figure 10:
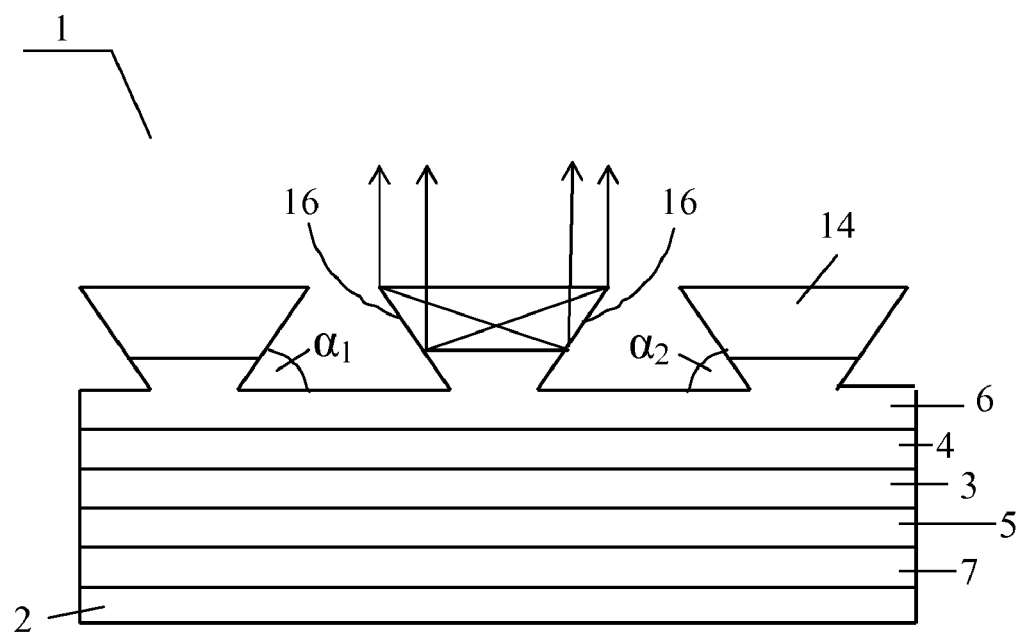

The following modification of the Laser 1 (see FIG. 10) differed from the modification of the Laser 1 shown in the FIG. 9 by the fact that the output facets 16 are executed with the inclined form and at that the angles $\alpha_1$ by their absolute value are equal to the angles $\alpha_2$ and are equal to 50°. In this case the output region 9 has the form of upturned trapezium in the longitudinal section. Thickness of the output regions 9 is equal to 2.2 µm. In this modification the output emission undergoes total internal reflection of the inclined output facets 16, changes its direction and goes out along the edges of the external surface of the leak-in layers 14 by direct incidence on them.

Figure 11:
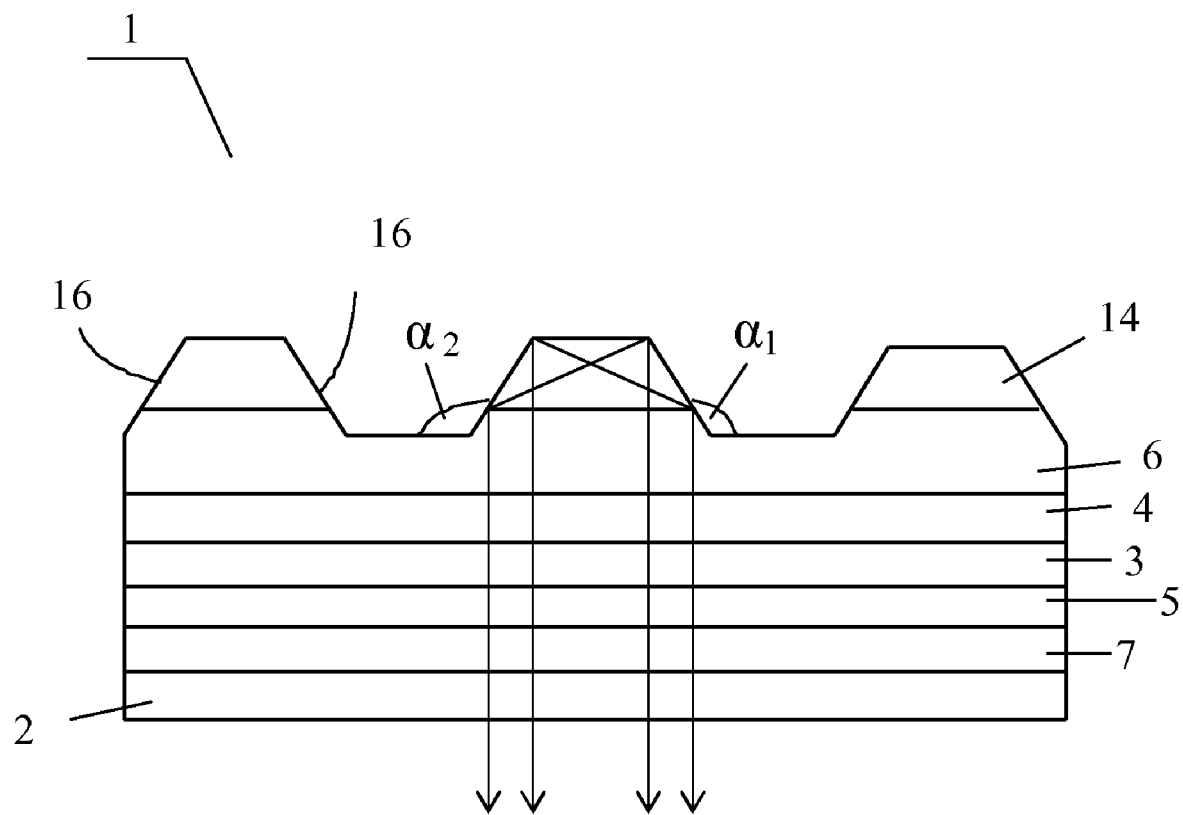

The following modification of the Laser 1 (see FIG. 11) differed from the previous one by the fact that the output facets 16 are executed with the inclined form and at that the angles $\alpha_1$ by their absolute values are equal to the angles $\alpha_2$ and are equal to 140°. In this case the output regions 9 have the form of trapezium in the longitudinal section and thickness of the output regions 9 was chosen equal to 1.7 µm. In this modification the output leaky emission undergoes total internal reflection of the inclined output facets 16 changes its direction and goes out through the substrate 2 transparent for emission by direct incidence upon it. Antireflecting optical coatings are applied on the substrate in places of output of the emission.

INDUSTRIAL APPLICABILITY

Injection lasers are used for pumping solid-state and fiber lasers and amplifiers, in the medical apparatus, laser technological equipment, lasers with doubled frequency of the generated emission and also are used as high-efficient powerful solid-state emission sources of wide application in the certain range of wavelengths including emitters of white light for lighting.

The invention claimed is:

1. An injection laser including a laser heterostructure containing at least an active layer consisting of at least one sublayer, at least one amplification region, edge facets, an optical resonator comprising reflectors, semiconducting layer for leak-in of emission, having refraction index $n_{IN}$, output facets oriented under certain linear angles of inclination, and metallization layers, wherein in the heterostructure, between the reflectors of the optical resonator, in the direction of a longitudinal amplification axis of the laser heterostructure a sequence is placed, consisting of alternating amplification regions and output regions optically coupled to at least one adjacent amplification region, in each of the output regions together with layers of the said laser heterostructure there is a semiconducting layer for leak-in of emission, disposed on the outer surface of the output region of the laser heterostructure and raising above the outer surface of said amplification region, wherein every said output region is restricted on its opposite sides in the direction of the said longitudinal amplification axis by the output facets provided at certain linear angles of inclination $\alpha_1$ and $\alpha_2$, correspondingly with respect to the external surface of the said amplification region, wherein the ratio of the refraction index $n_{IN}$ of the said leak-in layer to the effective refraction index $n_{eff}$ of the said heterostructure with the said leak-in layer included into it is equal to the number which is greater than one, wherein each amplification region comprises at least one metallization layer comprising at least one sub-layer, the metallization layer being disposed on the surface of the amplification region on the same side of the laser heterostructure as the semiconducting layer for leak-in of emission and wherein the emission transitions, inside the laser heterostructure, from the emission region of the sequence to the at least one adjacent output region of the same sequence.

2. The injection laser according to the claim 1 wherein the reflectors of the said optical resonator with reflection coefficients approximately equal to one are disposed are disposed on the edge facets.

3. The injection laser according to the claim 1 wherein in the heterostructure in the amplification region on the side of the emission output there are layers which are executed with such compositions and thickness values by which partial restriction of emission in the said heterostructure is realized in the said amplification region on the indicated side, at that on the side on the surface of said heterostructure the metallization sublayer with the high coefficient of emission reflection is placed.

4. The injection laser according to the claim 1 wherein corresponding metallization layers are placed in the output region on the external surface of the leak-in layer.

5. The injection laser according to the claim 1 further comprising waveguide layers disposed at both sides of the active layer.

6. The injection laser according to the claim 1 wherein in the heterostructure in the amplification region on the side opposite to the emission output side there are the layers which are executed with such compositions and thickness values by which a complete restriction of emission in the amplification region of said heterostructure is realized in that on an indicated side on the surface of said heterostructure the metallization sublayer with the high coefficient of emission reflection is placed.

7. The injection laser according to the claim 1 wherein said amplification region consists of at least two stripe amplification subregions, the tripe amplification subregions are disposed in parallel along the longitudinal amplification axis and subdivided using side limiting regions, the refraction coefficient of said side limiting regions being lower than the effective refraction coefficient of the heterostructure in the amplification subregions.

8. The injection laser according to the claim 1 wherein the linear angles $\alpha_1$ and $\alpha_2$ are equal by their absolute values and are equal to $(\pi/2)$, while the semiconducting leak-in layer in the output region has a thickness exceeding the length of the output region multiplied by the tangent of the angle $\phi$ of the emission leak from the active layer into the leak-in layer while the angle $\phi$ is equal to the arc cosine of the ratio $n_{eff}$ to $n_{IN}$.

9. The injection laser according to the claim 1 wherein the linear angles $\alpha1$ and $\alpha_2$ are equal by their absolute values and are equal to $(\pi/2)+(\phi)$.

10. The injection laser according to the claim 1 wherein the linear angles $\alpha_1$ and $\alpha_2$ are equal by their absolute values and are equal to $(\pi/4)+(\phi/2)$.

11. The injection laser according to the claim 1 wherein the linear angles $\alpha_1$ and $\alpha_2$ are equal by their absolute values and are equal to $(3\pi/4) \pm(\phi/2)$.

\* \* \* \* \*